(12) United States Patent
Folker

(10) Patent No.: US 10,083,790 B1
(45) Date of Patent: Sep. 25, 2018

(54) METHOD AND APPARATUS FOR ATTACHING MAGNETIC COMPONENTS TO PRINTED CIRCUIT BOARDS

(71) Applicant: Universal Lighting Technologies, Inc., Madison, AL (US)

(72) Inventor: Donald Folker, Madison, AL (US)

(73) Assignee: Universal Lighting Technologies, Nashville, TN (US)

( * ) Notice: Subject to any disclaimer, the term of this patent is extended or adjusted under 35 U.S.C. 154(b) by 0 days.

(21) Appl. No.: 15/832,861

(22) Filed: Dec. 6, 2017

Related U.S. Application Data

(60) Provisional application No. 62/455,157, filed on Feb. 6, 2017.

(51) Int. Cl.
| | |
|---|---|
| *H01F 27/29* | (2006.01) |
| *H05K 1/18* | (2006.01) |
| *H05K 1/11* | (2006.01) |
| *H01F 27/24* | (2006.01) |
| *H01F 27/32* | (2006.01) |
| *H05K 3/00* | (2006.01) |
| *H05K 3/30* | (2006.01) |
| *H01F 27/28* | (2006.01) |

(52) U.S. Cl.
CPC .......... *H01F 27/292* (2013.01); *H01F 27/24* (2013.01); *H01F 27/28* (2013.01); *H01F 27/325* (2013.01); *H05K 1/111* (2013.01); *H05K 1/181* (2013.01); *H05K 3/0011* (2013.01); *H05K 3/306* (2013.01); *H05K 2201/1003* (2013.01)

(58) Field of Classification Search
CPC ...... H01F 27/292; H01F 27/297; H01F 27/24; H01F 27/28; H01F 27/325; H01F 2027/297; H05K 1/113; H05K 1/115; H05K 3/306
See application file for complete search history.

(56) References Cited

U.S. PATENT DOCUMENTS

| | | |
|---|---|---|
| 2,561,855 A | 7/1951 | Gould |
| 4,916,424 A | 4/1990 | Kijima |
| 4,931,761 A | 6/1990 | Kijima |
| 5,926,946 A | 7/1999 | Minato et al. |
| 6,980,077 B1 | 12/2005 | Chandrasekaran et al. |
| 7,564,335 B1 * | 7/2009 | Yang ................. H01F 27/06 336/192 |
| 7,646,281 B2 | 1/2010 | Diekmann et al. |
| 8,031,042 B2 | 10/2011 | Silva |

(Continued)

*Primary Examiner* — Hoa C Nguyen
(74) *Attorney, Agent, or Firm* — Patterson Intellectual Property Law, P.C.; Gary L. Montle; Jerry Turner Sewell

(57) ABSTRACT

A bobbin provides secure attachment of a magnetic component to a printed circuit board. The circuit board includes a set of slotted apertures and a set of tubular apertures. The bobbin includes at least two pin rails and a plurality of standoffs proximate each pin rail. L-shaped pins are attached to one of the pin rails. Straight pins are attached to the other pin rail. The component further includes a core, and at least one winding. The L-shaped pins are shaped to pass through and slide within the set of slotted apertures. The L-shaped pins engage the bottom surface of the circuit board when the straight pins are inserted through the set of tubular apertures (i.e., in a secured position). In the secured position, the magnetic component is held in place against the top surface of the circuit board and provides a soldering area for mounting on the bottom surface.

5 Claims, 10 Drawing Sheets

(56) References Cited

U.S. PATENT DOCUMENTS

| | | | |
|---|---|---|---|
| 9,666,355 B1 | 5/2017 | Folker et al. | |
| 9,837,194 B1 | 12/2017 | Folker et al. | |
| 2002/0057029 A1* | 5/2002 | Kataja | H01F 5/04 |
| | | | 310/194 |
| 2010/0026445 A1* | 2/2010 | Lin | H01F 27/266 |
| | | | 336/84 R |
| 2011/0260820 A1* | 10/2011 | Liao | H01F 27/325 |
| | | | 336/192 |

* cited by examiner

METHOD AND APPARATUS FOR ATTACHING MAGNETIC COMPONENTS TO PRINTED CIRCUIT BOARDS

CROSS-REFERENCES TO RELATED APPLICATIONS

This application claims benefit of the following patent application which is hereby incorporated by reference: U.S. Provisional Application No. 62/455,157, filed on Feb. 6, 2017, for "METHOD AND APPARATUS FOR ATTACHING MAGNETIC COMPONENTS TO PRINTED CIRCUIT BOARDS."

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

FIELD OF THE INVENTION

The present invention relates generally to magnetic device structures. More particularly, the present invention relates to an improved system and method for mounting magnetic devices on printed circuit boards.

BACKGROUND OF THE INVENTION

Designers of magnetic devices such as transformers or inductors were at one time primarily concerned with core material and size. In recent years however, mounting, packaging, and automation have become progressively more important with regard to the ability of the magnetic devices to be efficiently mounted on a printed circuit board during the manufacturing process, whether robotically or manually. A typical magnetic device includes a plurality of straight pins extending from pin rails attached to a bobbin. The typical straight-pin design allows the magnetic device to float out of the holes in the printed circuit board during the mounting and soldering processes. In some manufacturing processes, a weight is placed on top of the magnetic device to hold the magnetic device in place until the soldering operation is complete. This is an additional step in the manufacturing process, and the weight must be removed after the soldering operation is completed. Another conventional method of holding the magnetic device in place during the soldering process is to crimp the pins of the bobbin on the back side of the printed circuit board. This method also adds an additional step to the manufacturing process. These additional steps to the manufacturing process create difficulties when attempting to automate the process and may increase manufacturing time and thereby reduce output. The additional steps decreased efficiency and affect the total cost of the component.

BRIEF SUMMARY OF THE INVENTION

It is desirable, therefore, to provide a magnetic device assembly that enables secure placement of a magnetic device on the top side of a printed circuit board to prevent the magnetic device from floating out of the holes while solder joints are attached to the bottom of the printed circuit board.

The present invention provides a method and apparatus discussed herein for enabling magnetic components to be securely attached to the top surface of a printed circuit board while pins are soldered to the bottom surface of the printed circuit board.

A magnetic device includes a bobbin, which incorporates a plurality of L-shaped pins positioned on a first pin rail, and a plurality of conventional straight-pins positioned on a second pin rail. The elongated lateral portion (arm) of each L-shaped pin is positioned through a corresponding slot in the printed circuit board. The magnetic component is initially tilted with respect to the top surface of the printed circuit board. The vertical portions of the L-shaped pins are slid within the printed circuit board slots until the straight-pins are generally aligned with the corresponding cylindrical holes of the printed circuit board. The straight pins are then inserted into the cylindrical holes as the magnetic component is rotated to an untilted, horizontal, orientation with respect to the printed circuit board. In this final untilted orientation, the upper surface of the arm of each L-shaped pin engages the lower surface of the printed circuit board to prevent upward vertical movement of the magnetic component. The straight-pins prevent horizontal movement with respect to the printed circuit board. Thus, the magnetic component is effectively immobilized for soldering. Each arm of the L-shaped pins is an element of a strong solder joint connection on the bottom side of the printed circuit board.

The combination of L-shaped pins and straight-pins disclosed herein enables secure placement of the bobbin on the printed circuit board. The combination facilitates a new more efficient method of mounting large magnetic components without limiting the spacing between respective pins. The L-shaped and straight-pin configuration locks the magnetic components in place for efficient and effective soldering, further eliminating the additional steps of either adding a weight or crimping the pins to avoid float out during soldering.

One aspect of the embodiment disclosed herein is a bobbin for a magnetic component that comprises a bobbin body having a first and a second flange. A passage extends through the bobbin body between the first and second flanges along a longitudinal axis. A first pin rail is attached to the first flange. The first pin rail extends downwardly away from the bobbin in a first direction. The first pin rail has a respective lower side. A second pin rail is attached to the second flange. The second pin rail extends downwardly away from the bobbin in the first direction. The second pin rail has a respective lower side. The lower side of the first pin rail has a first pin row made up of a plurality of L-shaped pins. Each L-shaped pin has a substantially vertical stem extending perpendicularly from the respective lower side of the first pin rail and has a substantially horizontal arm extending perpendicularly from the bottom of the stem. The lower side of the second pin rail has a second pin row made up of a plurality of straight-pins. Each straight-pin extends perpendicularly from the respective lower side of the second pin rail.

Another aspect in accordance with the embodiments disclosed herein is an electronic assembly comprises a printed circuit board having a top surface and a bottom surface. The top surface and the bottom surface define a thickness therebetween. The printed circuit board comprises a first array of slotted apertures and a second array of tubular apertures. Each aperture extends through the printed circuit board from the top surface to the bottom surface. A bobbin includes a first plurality of L-shaped pins and a second plurality of straight pins. The L-shaped pins extend through the slotted apertures. The straight pins extend through the tubular apertures. The electronic assembly further comprises a core. At least one winding is positioned on the bobbin between a first flange and a second flange.

Another aspect in accordance with the embodiments disclosed herein is a method for securely attaching a magnetic component to a printed circuit board. The method comprises forming a plurality of tubular apertures in the printed circuit board. Each tubular aperture is sized and positioned to accommodate passage of a corresponding straight pin of the magnetic component. The method further comprises forming a plurality of slotted apertures in the printed circuit board. Each slotted aperture is shaped and positioned to accommodate passage of a corresponding L-shaped pin of the magnetic component. Each L-shaped pin is inserted though a respective slotted apertures by tilting the magnetic component at an angle with respect to the printed circuit board and sliding the plurality of L-shaped pins within the slotted apertures. The tilting and sliding continues until the plurality of straight pins are generally aligned with the plurality of tubular apertures. The method further comprises inserting the plurality of straight pins into the plurality of tubular apertures by rotating the magnetic component to a non-tilted (e.g., parallel) orientation with respect to the printed circuit board.

Another aspect in accordance with the embodiments disclosed herein is a bobbin for a magnetic component comprises a bobbin body having a first and a second flange. A passage extends through the bobbin body between the first and second flanges along a longitudinal axis. A first pin rail is attached to the first flange. The first pin rail extends downwardly away from the bobbin in a first direction. The first direction is perpendicular to the longitudinal axis. The first pin rail has a respective inner side facing the second flange. The first pin rail also has a lower side. The respective lower side of the first pin rail has a respective width that is parallel to the longitudinal axis and a respective length perpendicular to the respective width. The respective lower side of the first pin rail faces away from the bobbin in a direction parallel to the first direction. A second pin rail is attached to the second flange. The second pin rail extends downwardly away from the bobbin in the first direction. The second pin rail has a respective inner side facing the first flange. The second pin rail also has a lower side. The respective lower side of the second pin rail has a respective width that is parallel to the longitudinal axis and a respective length perpendicular to the respective width. The respective lower side of the second pin rail faces away from the bobbin in a direction parallel to the first direction. The lower side of the first pin rail has a first pin row made up of a plurality of L-shaped pins. Each L-shaped pin has a substantially vertical stem extending perpendicularly from the respective lower side of the first pin rail and has a substantially horizontal arm extending perpendicularly from the bottom of the respective stem. The lower side of the second pin rail has a second pin row made up of a plurality of straight-pins. Each straight-pin extends perpendicularly from the respective lower side of the second pin rail.

DETAILED DESCRIPTION OF THE INVENTION

In the following description, various dimensional and orientation words, such as height, width, length, longitudinal, horizontal, vertical, up, down, left, right, tall, low profile, and the like, may be used with respect to the illustrated drawings. Such words are used for ease of description with respect to the particular drawings and are not intended to limit the described embodiments to the orientations shown. It should be understood that the illustrated embodiments can be oriented at various angles and that the dimensional and orientation words should be considered relative to an implied base plane that would rotate with the embodiment to a revised selected orientation.

Figure 1:
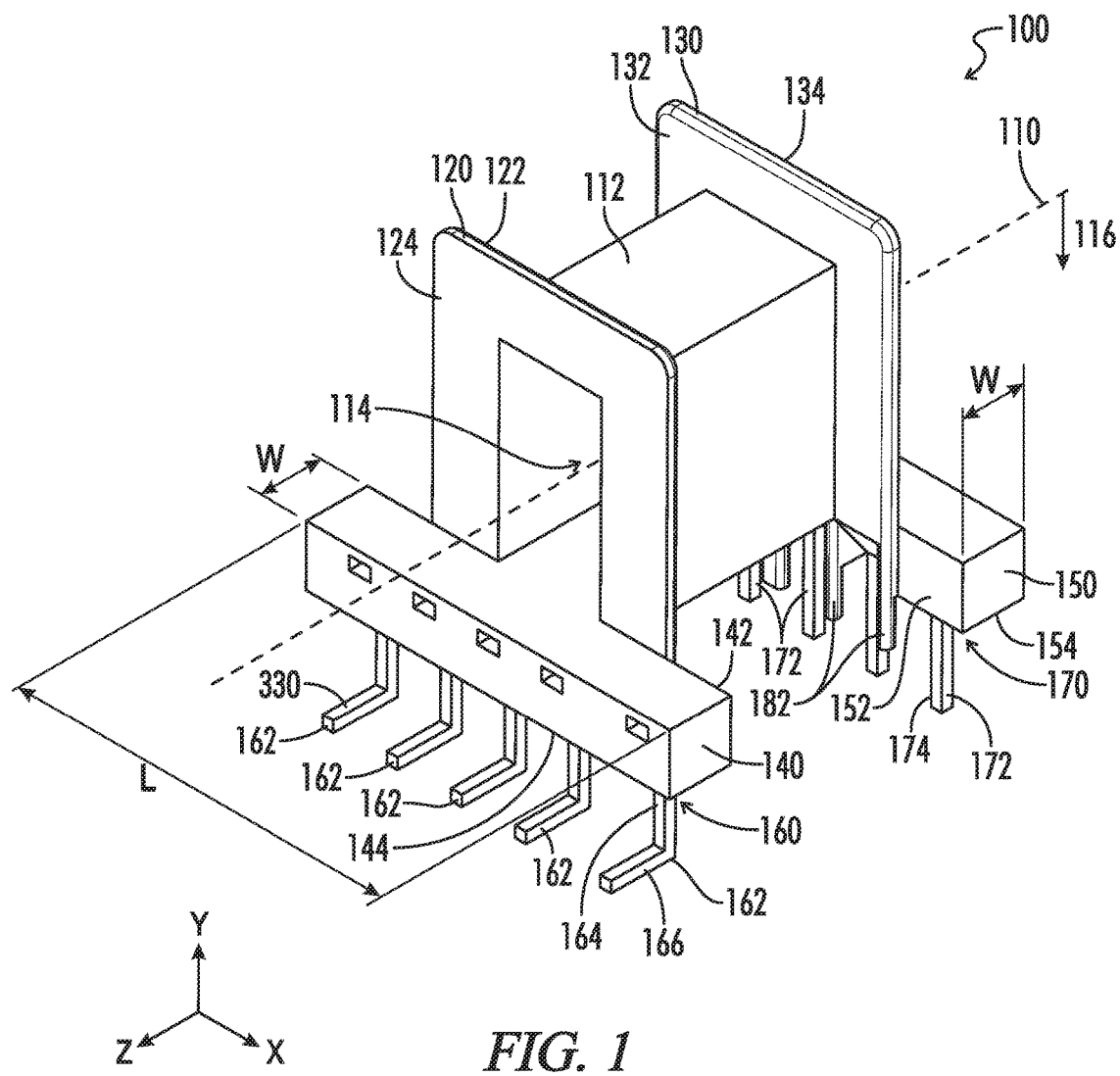
FIG. 1 illustrates a perspective view of an embodiment of a bobbin in accordance with the present invention.
Figure 2:
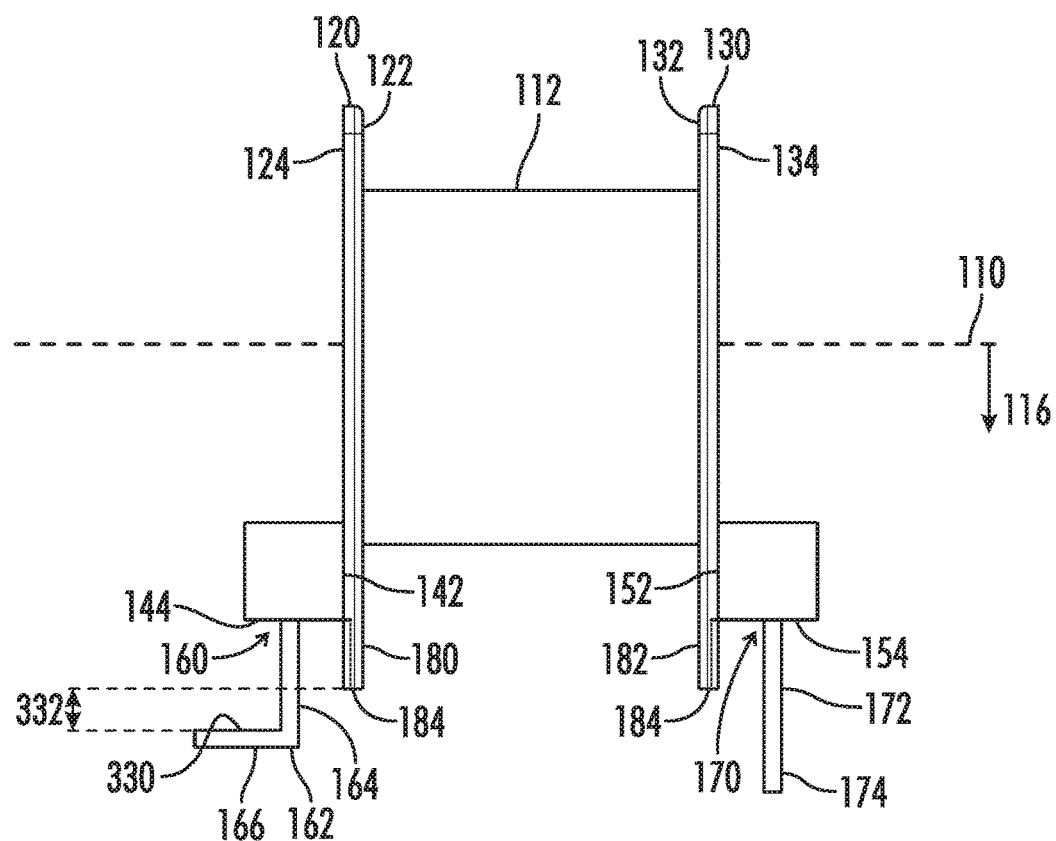
FIG. 2 illustrates a right side elevational view of the bobbin of FIG. 1.
Figure 3:
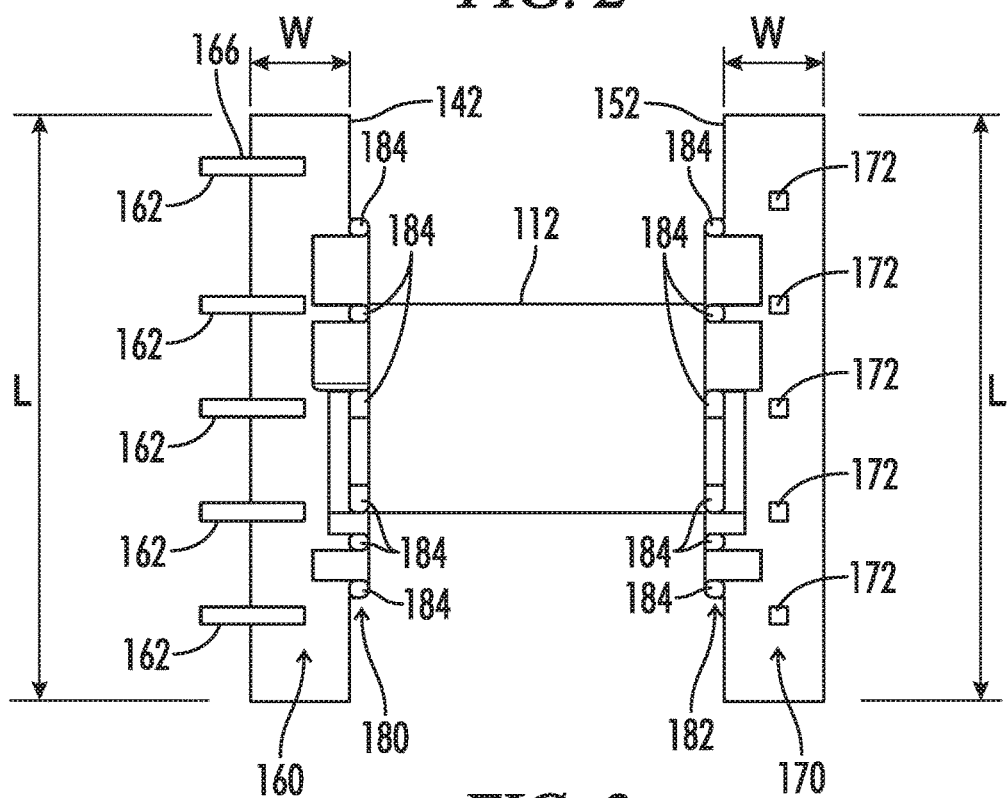
FIG. 3 illustrates bottom view of the bobbin of FIG. 1.

FIG. 1 illustrates a perspective view of a bobbin 100, which has a combination L-shape pin and straight pin configuration to provide secure attachment of the bobbin to a circuit board. FIG. 2 illustrates a side elevational view of the bobbin 100 of FIG. 1. FIG. 3 illustrates a bottom view of the bobbin 100 of FIG. 1.

The bobbin 100 includes a longitudinal axis 110. The bobbin 100 further includes a bobbin body 112, which surrounds a central passageway 114 that extends along the longitudinal axis 110. The central passageway 114 extends from a first end flange 120 to a second end flange 130. In the illustrated embodiment, the opening into the central passageway 114 has a generally rectangular profile (e.g., a square profile). The profile of the central passageway 114 may differ in other embodiments (e.g., non-square rectangular, circular, oval, or the like).

In the illustrated embodiment, the first end flange 120 has a respective inner surface 122 facing inward toward the bobbin body 112. The first end flange 120 also has a respective outer surface 124 facing outward away from the bobbin body 112. The outer surface 124 of the first end flange 120 is attached to a first pin rail 140. The second end flange 130 has a respective inner surface 132 facing inward toward the bobbin body 112. The second end flange 130 has a respective outer surface 134 facing outward away from the bobbin body 112. The outer surface 134 of the second end flange 130 is attached to a second pin rail 150.

Each of the first pin rail 140 and the second pin rail 150 extends downward away from the respective end flange 120, 130 in a first direction 116 perpendicular to the longitudinal axis 110. The first pin rail 140 has a respective inner side 142 (FIG. 2) facing the second pin rail 150 and has a respective lower side 144 facing away from the central passageway 114 in the first direction 116. The second pin rail 150 has a respective inner side 152 facing the first pin rail 140 and has a respective lower side 154 facing away from the central passageway 114 in the first direction 116. As shown in FIG. 3, each pin rail 140, 150 has a respective width (W) parallel to the longitudinal axis 110 and has a respective length (L) perpendicular to (transverse to) the respective width.

In the illustrated embodiment, the bobbin 100 has a first pin row 160. The first pin row 160 is located on the lower side 144 of the first pin rail 140. The first pin row 160 comprises a plurality of L-shaped pins 162. Each L-shaped pin 162 has a substantially vertical stem 164 extending perpendicularly from the respective lower side of the first pin rail 140. Each L-shaped pin 162 has a substantially horizontal arm 166 extending from the vertical stem 164. Each horizontal arm 166 extends from the end of the respective vertical stem 164 at a location on the stem farthest from the lower side 144 of the first pin rail 140. The horizontal arm 166 is parallel to the lower side 144 of the first pin rail 140. In the illustrated embodiment, each horizontal arm 166 of the plurality of L-shaped pins 162 is parallel to the longitudinal axis 110 and is directed away from the bobbin 100.

The bobbin 100 has a second pin row 170. The second pin row 170 is located on the lower side 154 of the second pin rail 150. The second pin row 170 comprises a plurality of straight pins 172. Each of the pins of plurality of straight pins 172 comprises a single straight shaft 174 having a square cross section. The shape of each of the pins of the plurality of straight pins 172 may differ in other embodiments (e.g., non-straight, circular, square, or the like).

In the illustrated embodiment, the bobbin 100 includes a first plurality of standoffs 180 (FIG. 3) and a second plurality of standoffs 182. The first plurality of standoffs 180 are located proximate to the first pin rail 140 and extend in the first direction 116. The first plurality of standoffs 180 are positioned between the first pin row 160 and the second pin rail 150. The second plurality of standoffs 182 are located proximate to the second pin rail 150 and extend in the first direction 116. In the illustrated embodiment, the second plurality of standoffs 182 are positioned between the second pin row 170 and the first pin rail 140. In the illustrated embodiment, each standoff of the first and second plurality of standoffs 180, 182 has a respective engagement face 184 (FIG. 3) directed away from the bobbin in the first direction 116.

Figure 4:
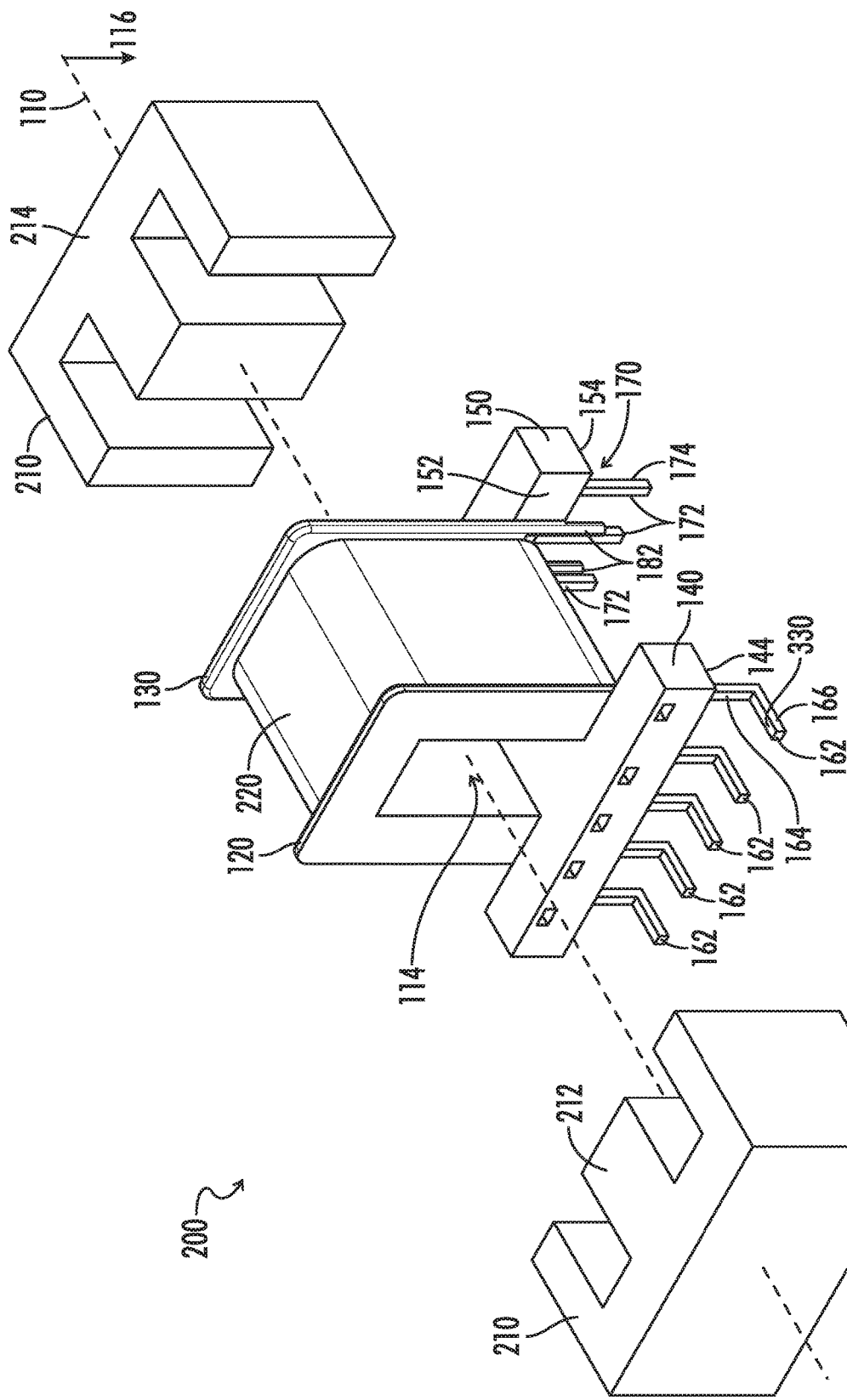
FIG. 4 illustrates an exploded perspective view of an embodiment of a magnetic component, which includes the bobbin of FIGS. 1-3 in combination with a winding and two E-cores.
Figure 5:
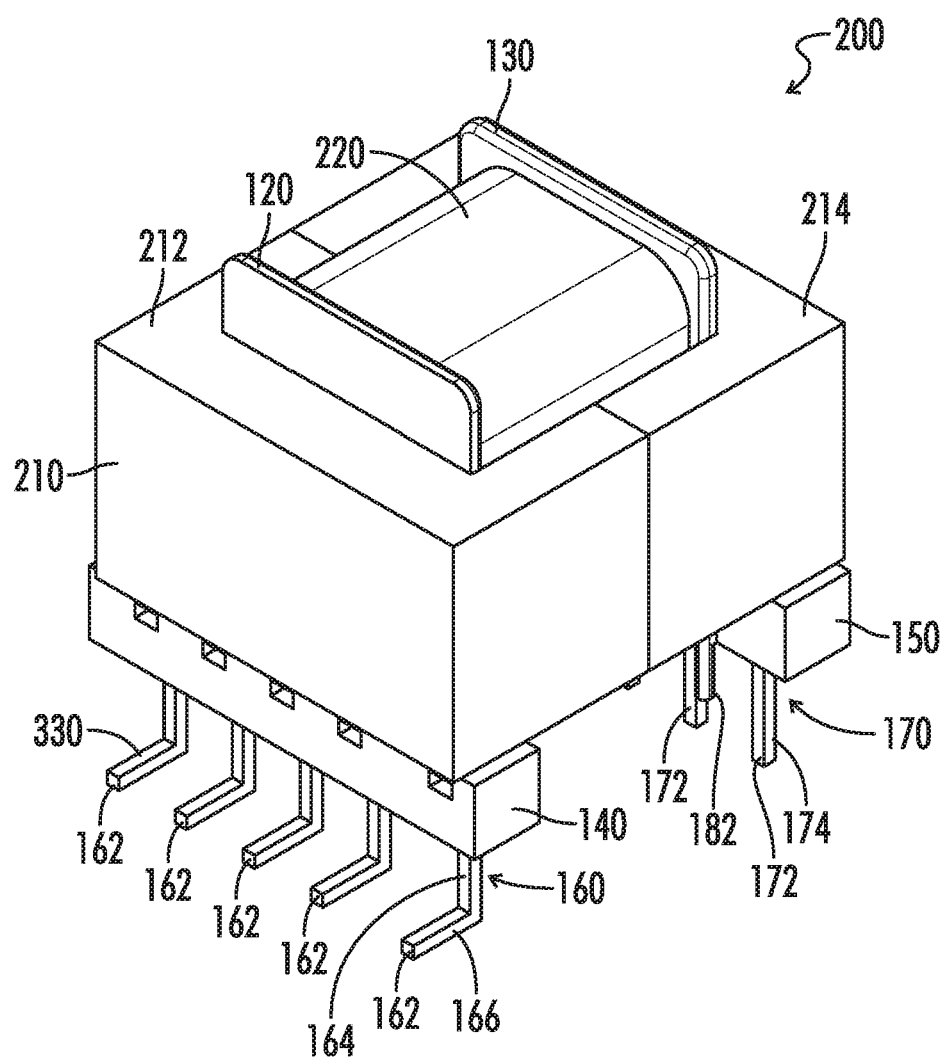
FIG. 5 illustrates an assembled perspective view of the magnetic component of FIG. 4.

FIG. 4 illustrates an exploded perspective view of a magnetic component 200 utilizing the bobbin 100. FIG. 5 illustrates a perspective view of the magnetic component 200 of FIG. 4. The magnetic component 200 of FIGS. 4-5 incorporates the bobbin 100 of FIGS. 1-3; and like elements are numbered accordingly in FIGS. 4-5.

The magnetic component 200 comprises the bobbin 100 and a core 210. In the illustrated embodiment the core 210 comprises a first E-core body 212 and a second E-core body 214. Each E-core body 212, 214 has a respective middle leg shaped to be received by the central passageway 114 of the bobbin 100. In some embodiments the core 210 may be shaped differently (e.g., a theta core, an E-I core, or the like).

In the illustrated embodiment, the magnetic component 200 further includes at least one winding 220. The winding 220 is disposed on the bobbin body 112 between the inner surface 122 of the first end flange 120 and the inner surface 132 of the second end flange 130. The winding 220 includes wires (not shown) connected to selected L-shaped pins of the plurality of L-shaped pins 162 and includes wires (not shown) connected to selected straight pins of the second plurality of straight pins 172.

Figure 6:
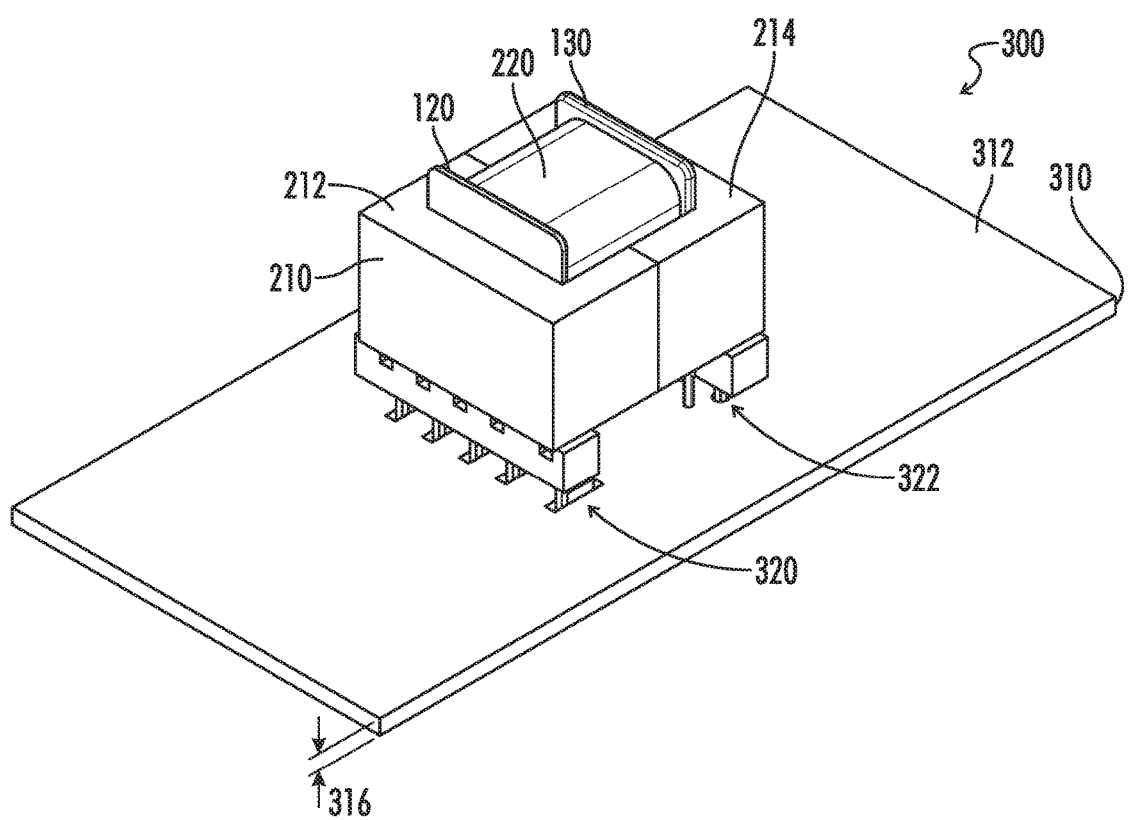
FIG. 6 illustrates a perspective view of an embodiment of an electronic assembly that combines the magnetic component of FIGS. 4-5 with a printed circuit board.
Figure 7:
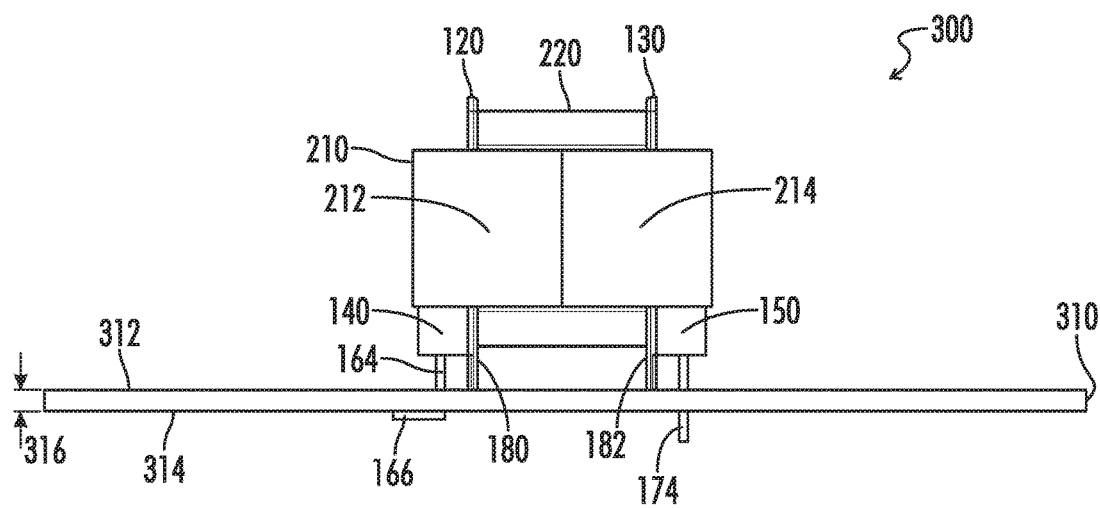
FIG. 7 illustrates a right side view of the electronic assembly of FIG. 6.
Figure 8:
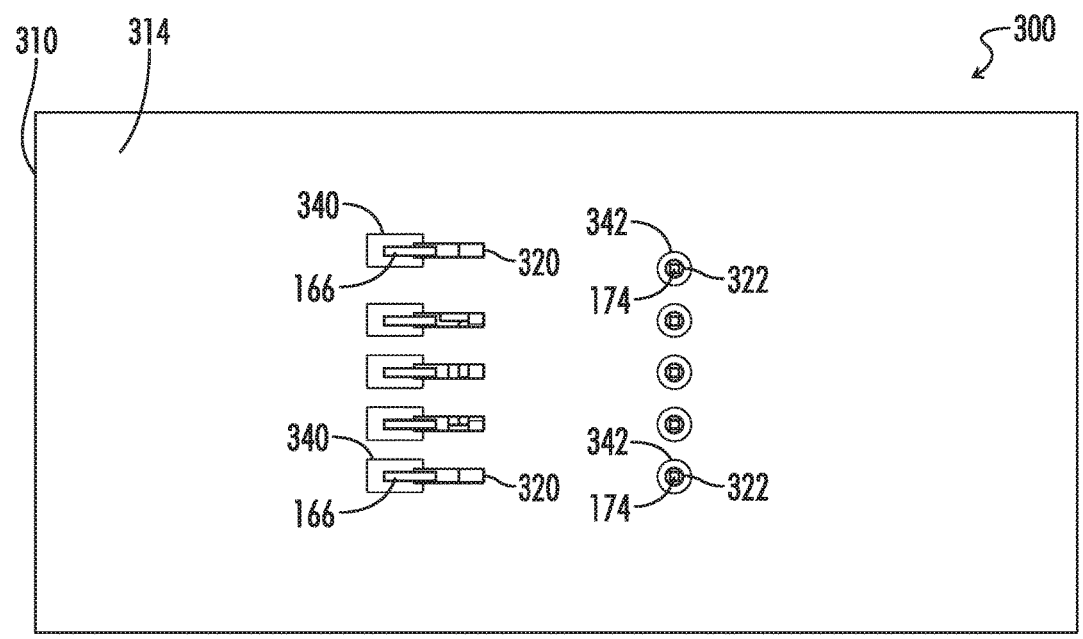
FIG. 8 illustrates a bottom view of the electronic assembly of FIGS. 6-7 with pins positioned proximate to solder pads on a bottom surface of the printed circuit board.

FIG. 6 illustrates a perspective view of an electronic assembly 300 utilizing the pins 162, 172 of the bobbin 100 to securely attach the magnetic component 200 to a printed circuit board 310. FIG. 7 illustrates a side view of the electronic assembly 300 of FIG. 6. FIG. 8 Illustrates a bottom view of the electronic assembly 300 of FIGS. 6-7. The electronic assembly 300 of FIGS. 6-8 incorporates the bobbin 100 of FIGS. 1-3 utilized in the magnetic component 200 of FIGS. 4-5; and like elements are numbered accordingly in FIGS. 6-8.

The electronic assembly 300 comprises the magnetic component 200 and the printed circuit board 310. The printed circuit board 310 has a top surface 312 and a bottom surface 314. A thickness 316 (see FIG. 7) of the printed circuit board 310 is defined between the top surface 312 and the bottom surface 314. A first array of slotted apertures 320, and a second array of tubular apertures 322 are formed in the printed circuit board 310 and extend through the printed circuit board 310 from the top surface 312 to the bottom surface 314. In the illustrated embodiment, the first array of slotted apertures 320 is arranged to receive the plurality of L-shaped pins 162 of the bobbin 100. The second array of tubular apertures 322 is arranged to receive the straight shafts 174 of the plurality of straight pins 172 when the straight shafts 174 are generally aligned with the tubular apertures 322 by sliding the plurality of L-shaped pins 162 within the slotted apertures 320 as described below. In the illustrated embodiment, each tubular aperture 322 is cylindrical (e.g., has a circular cross-sectional profile). The cross-sectional profile of each aperture of the array of tubular apertures may differ in other embodiments (e.g., non-circular, square, rectangular, oval, or the like).

In the illustrated embodiment of the electronic assembly 300, each arm 166 of the plurality of L-shaped pins 162 has a respective top surface 330 (see FIG. 1). A distance 332 (see FIG. 2) is defined between the respective top surface 330 of the arm 166 and the engagement face 184 (see FIG. 3) of a respective standoff of the first plurality of standoffs 180. The distance 332 is slightly greater than the thickness 316 of the printed circuit board 310.

In the illustrated embodiment of the electronic assembly 300, as shown in FIGS. 6-7, the plurality of L-shaped pins 162 and the plurality of straight pins 172 of the magnetic component 200 are in a pins-secured position 700. As shown in FIG. 8, the plurality of L-shaped pins 162 and the plurality of straight pins 172 of the magnetic component 200 are further soldered into place on the bottom surface 314 of the printed circuit board 310. The magnetic component 200 is affectively locked in the pins-secured position once the plurality of pins 162, 172 have been soldered.

In the illustrated embodiment of the electronic assembly 300, as shown in FIG. 8, the bottom surface 314 of the printed circuit board 310 may have a first plurality of solder joint areas or solder pads 340 positioned proximate to each slotted aperture of the first array of slotted apertures 320. The bottom surface 314 of the printed circuit board 310 may also have a second plurality of solder joint areas or solder pads 342 positioned proximate to each tubular aperture of the second array of tubular apertures 322. The arms 166 of the plurality of L-shaped pins 162 and exposed extended portions of the plurality of straight pins 172 may then be manually soldered or otherwise affixed to the bottom surface 314 of the printed circuit board 310 corresponding to the solder joint areas or pads 340, 342 to form solder joints in a manner known in the art.

FIGS. 9-14 illustrate a structure and a method for securely attaching the magnetic component 200 of the present invention to the printed circuit board 310.

Figure 9:
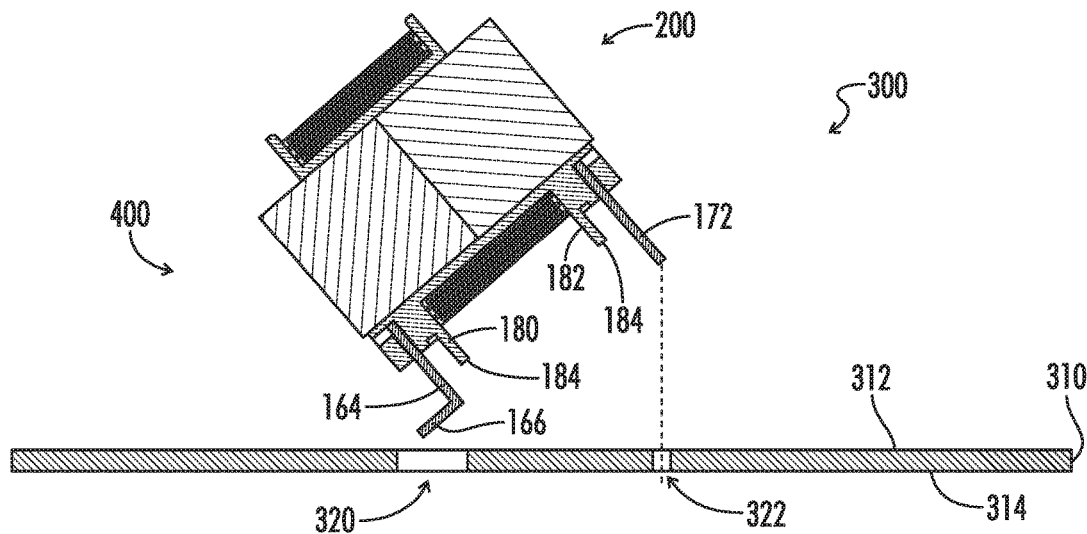
FIG. 9 illustrates a cross-sectional side view of electronic assembly of FIGS. 6-8 with the magnetic component in an initial unsecured position.

FIG. 9 illustrates a cross-sectional side view of the electronic assembly 300 of FIGS. 6-8 with the magnetic component 200 in an initial unsecured position 400. In the initial unsecured position 400, the magnetic component 200 is tilted with respect to the printed circuit board 310. The plurality of L-shaped pins 162 of the magnetic component 200 are generally aligned above the first array of slotted apertures 320 of the printed circuit board 310.

Figure 10:
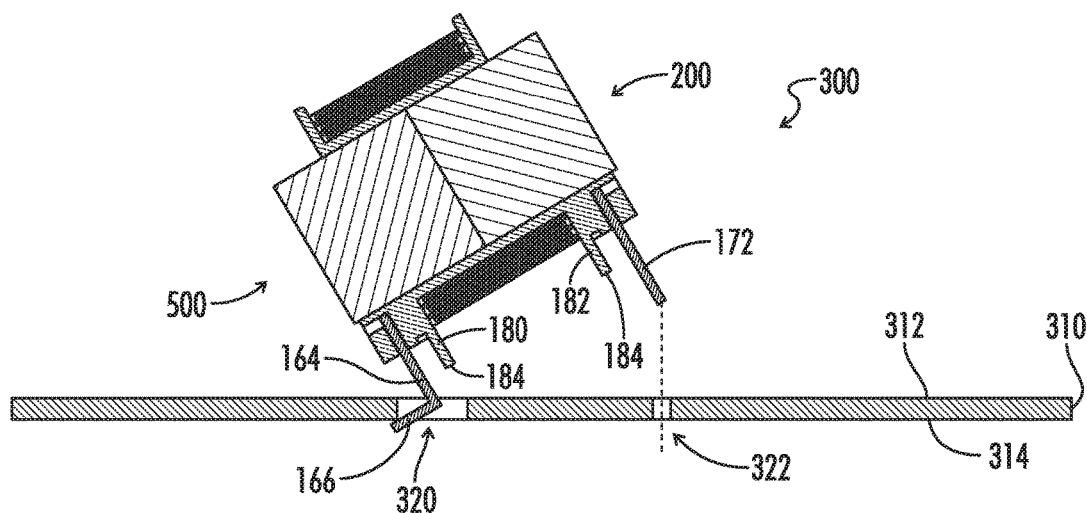
FIG. 10 illustrates a cross-sectional side view of electronic assembly of FIGS. 6-8 with the magnetic component in a second unsecured position.

FIG. 10 illustrates a cross-sectional side view of the electronic assembly 300 of FIGS. 6-8 with the magnetic component 200 in a second unsecured position 500. In the second unsecured position, the magnetic component 200 remains tilted with respect to the printed circuit board 310. The plurality of L-shaped pins 162 of the magnetic component 200 are inserted through each corresponding slotted aperture 320 of the printed circuit board 310.

Figure 11:
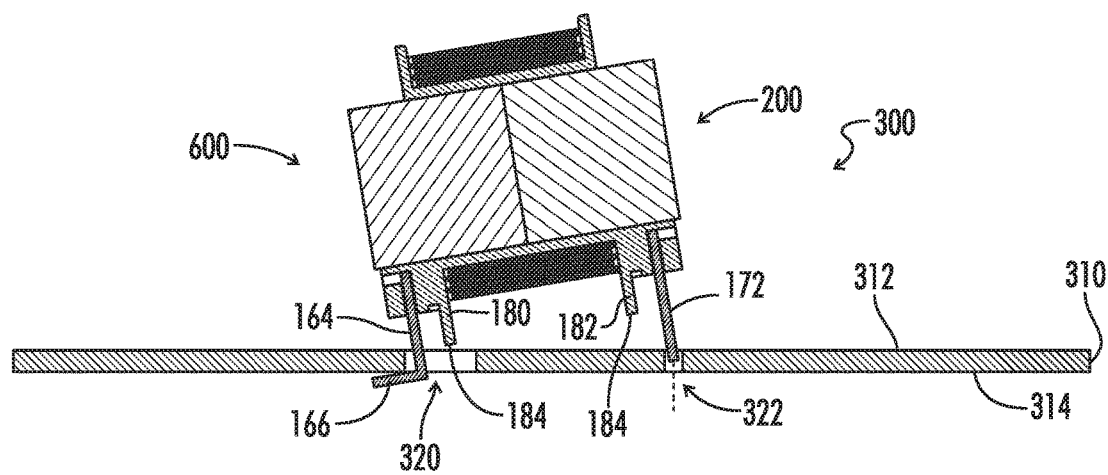
FIG. 11 illustrates a cross-sectional side view of electronic assembly of FIGS. 6-8 with the magnetic component in a third unsecured position.

FIG. 11 illustrates a cross-sectional side view of the electronic assembly 300 of FIGS. 6-8 with the magnetic component 200 in a third unsecured position 600. In the third unsecured position, the magnetic component 200 has a reduced tilt with respect to the printed circuit board 310. The plurality of L-shaped pins 162 of the magnetic component 200 are slid within each corresponding slotted aperture 320 of the printed circuit board until the vertical stem 164 of each L-shaped pin is generally in contact with a respective end of each slotted aperture 320. The plurality of straight pins 172 are generally aligned with the second array of tubular apertures 322 when the magnetic component 200 is in the third unsecured position 600.

Figure 12:
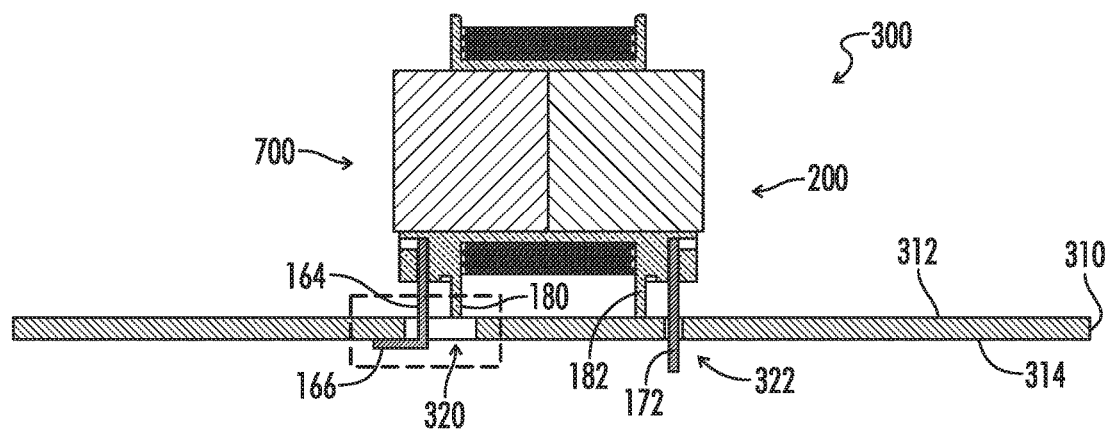
FIG. 12 illustrates a cross-sectional side view of electronic assembly of FIGS. 6-8 in a pins-secured position ready to have solder applied to the pins.
Figure 13:
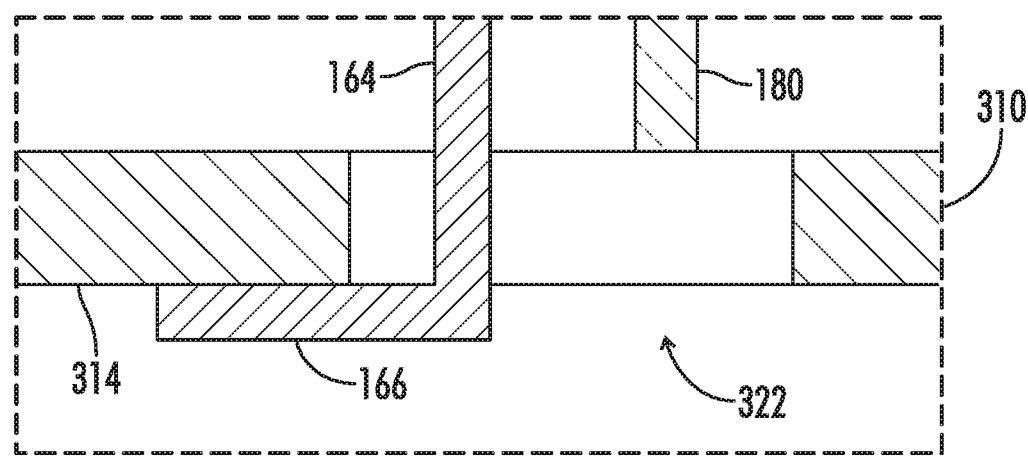
FIG. 13 illustrates an enlarged cross-sectional view taken within the area --13-- in FIG. 12.

FIG. 12 illustrates a cross-sectional side view of the electronic assembly 300 of FIGS. 6-8 with the magnetic component 200 in the pins-secured position 700. The magnetic component 200 in the pins-secured position 700 is untilted, and is therefore horizontal with respect to the printed circuit board 310. The respective top surface 330 of each arm 166 of the plurality of L-shaped pins 162 rests in the pins-secured position 700 against the bottom surface 314 of the printed circuit board 310. Each face 184 of first and second plurality of standoffs 180, 182 rests against the top surface 312 of the printed circuit board 310. The straight shaft 174 of each of the plurality of straight pins 172 rests in the pins-secured position 700 within corresponding apertures of the second array of tubular apertures 322. In the pins-secured position 700, the magnetic component 200 is prevented from upward vertical movement by the respective top surface 330 of each arm 166 of the plurality of L-shaped pins 162. The magnetic component 200 is prevented from downward vertical movement by each engagement face 184 of the first and second plurality of standoffs 180, 182. The magnetic component 200 is prevented from horizontal movement by each straight shaft 174 of the plurality of straight pins 172.

Figure 14:
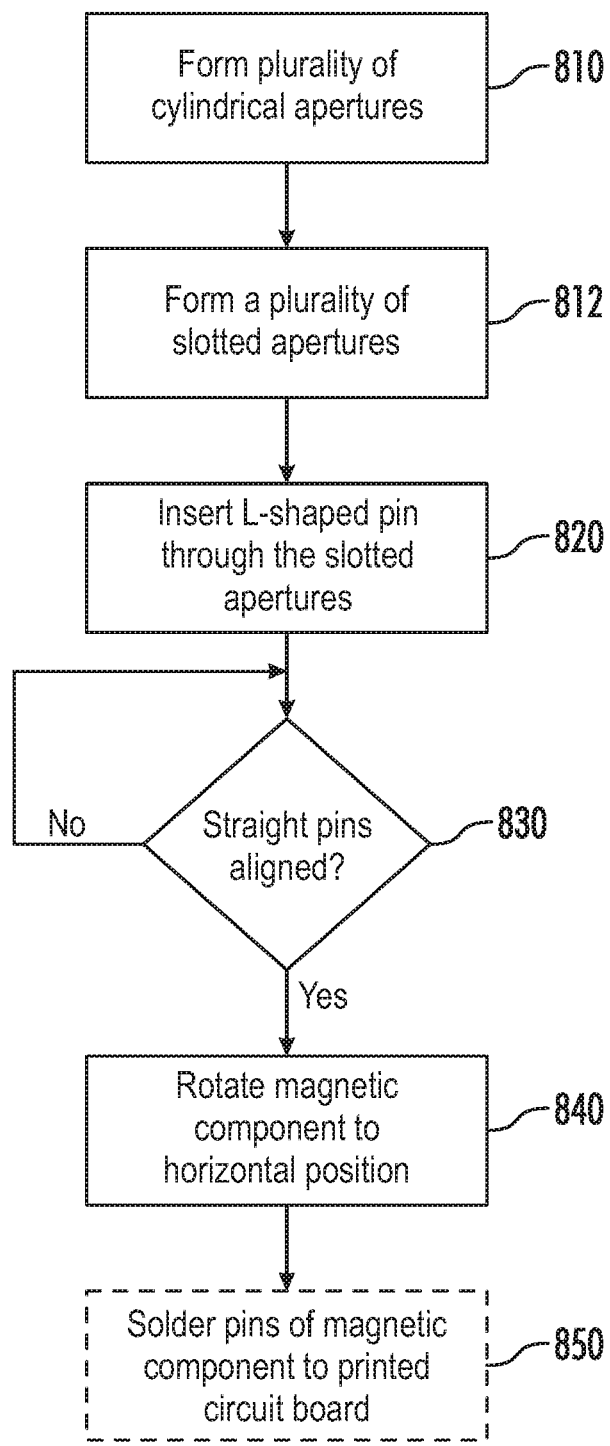
FIG. 14 illustrates a flow chart of the method of FIGS. 9-13.

The method for securely attaching the magnetic component 200 to the printed circuit board 310 illustrated in FIGS. 9-12 can also be represented by a flowchart 800 in FIG. 14. The method comprises a step 810 of forming a plurality of tubular apertures in the printed circuit board 310. Each aperture is shaped and positioned to accommodate the passage of a corresponding straight shaft 174 of each of the plurality of straight pins 172 of the magnetic component 200. The method further comprises a step 812 of forming a plurality of slotted apertures in the printed circuit board 310. Each slotted aperture is shaped and positioned to accommodate the passage of a corresponding L-shaped pin 162 of the magnetic component 200. The method further comprises a step 820 of inserting the plurality of L-shaped pins 162 though the plurality of slotted apertures 320 by tilting the magnetic component and sliding the plurality of L-shaped pins within the slotted apertures. The tilting and sliding step 820 continues until each straight shaft 174 of the plurality of straight pins 172 is generally aligned with the plurality of tubular apertures 318 as represented by a decision step 830. When each straight shaft 174 is aligned, the method further comprises a step 840 of inserting the plurality of straight pins 172 into the plurality of tubular apertures 318 by rotating the magnetic component 200 to a non-tilted (e.g., parallel) orientation with respect to the printed circuit board 310.

In some embodiments, the method further includes a step 850 of soldering at least one of the straight pins 172 to the bottom surface 314 of the printed circuit board 310. In other embodiments, the plurality of pins 162, 172 may be affixed to the bottom surface 314 of the printed circuit board 310 utilizing other manners and means as known in the art.

Thus, although there have been described particular embodiments of the present invention of a new and useful METHOD AND APPARATUS FOR ATTACHING MAGNETIC COMPONENTS TO PRINTED CIRCUIT BOARDS it is not intended that such references be construed as limitations upon the scope of this invention except as set forth in the following claims.

What is claimed is:

1. A bobbin for a magnetic component, the bobbin comprising:
   a bobbin body, the bobbin body having a first flange and a second flange, having a longitudinal axis, and having a passage extending through the bobbin body from the first flange to the second flange along the longitudinal axis;
   a first pin rail fixed to the first flange of the bobbin body and extending downwardly in a first direction away from the bobbin body to a respective lower side of the first pin rail;
   a second pin rail fixed to the second flange of the bobbin body and extending in the first direction away from the bobbin body to a respective lower side of the second pin rail;
   a first pin row comprising a first plurality of L-shaped pins, each L-shaped pin having a substantially vertical stem extending perpendicularly from the respective lower side of the first pin rail and a substantially horizontal arm extending from a bottom end of the stem, the horizontal arm being parallel to the respective lower side of the first pin rail;
   a second pin row comprising a second plurality of pins, the second plurality of pins comprising straight pins extending perpendicularly from the respective lower side of the second pin rail;

a first plurality of standoffs proximate to the first pin rail and extending in the first direction, the first plurality of standoffs positioned between the first pin row and the second pin rail; and a second plurality of standoffs proximate to the second pin rail and extending in the first direction, wherein each standoff in the first and second plurality of standoffs has a face parallel with the lower side of each of the first and second pin rails.

2. The bobbin of claim 1, wherein the second plurality of standoffs are positioned between the second pin row and the first pin rail.

3. The bobbin of claim 1, wherein the first plurality of standoffs comprises at least two standoffs.

4. The bobbin of claim 1, wherein the second plurality of standoffs comprises at least two standoffs.

5. The bobbin of claim 1, wherein the horizontal arm of each L-shaped pin is parallel to the longitudinal axis and is directed away from the bobbin.

\* \* \* \* \*